United States Patent [19]
Krauss

[11] Patent Number: 5,990,578
[45] Date of Patent: Nov. 23, 1999

[54] CAPACITIVE SENSOR ARRANGEMENT

[75] Inventor: Mathias Krauss, Ammerbuch, Germany

[73] Assignee: Zentrum Mikroelektronik Dresden GmbH, Dresden, Germany

[21] Appl. No.: 08/978,077

[22] Filed: Nov. 26, 1997

[30] Foreign Application Priority Data

Dec. 6, 1996 [DE] Germany ............................ 196 50 681

[51] Int. Cl.$^6$ ............................ H02M 3/06; H01H 35/00
[52] U.S. Cl. ............................ 307/116; 307/125; 307/109
[58] Field of Search .................................. 307/112, 113, 307/115, 116, 125, 108, 109, 110; 363/59

[56] References Cited

U.S. PATENT DOCUMENTS

| | | | |
|---|---|---|---|
| 4,975,701 | 12/1990 | Babanezhad et al. | 341/139 |
| 5,229,771 | 7/1993 | Hanlon | 341/166 |
| 5,465,604 | 11/1995 | Sherman | 73/1 DV |
| 5,583,290 | 12/1996 | Lewis | 73/514.18 |

FOREIGN PATENT DOCUMENTS

| | | |
|---|---|---|
| 228132 | 10/1985 | Germany . |
| 4115534 | 11/1992 | Germany . |
| 4136995 | 5/1993 | Germany . |
| 4230592 | 3/1994 | Germany . |

*Primary Examiner*—Jeffrey Gaffin
*Assistant Examiner*—Jonathan S. Keplan
*Attorney, Agent, or Firm*—Jordon and Hamburg LLP

[57] ABSTRACT

The invention relates to a capacitive sensor arrangement with a charge balance frequency converter. This consists of an operational amplifier, between the output and inverting input of which an integrating capacitor is connected and the noninverting input of which is connected with a reference potential. Furthermore, the arrangement consists of a first capacitor, one electrode of which can be connected with a first potential or with the reference potential and the other electrode of which can be connected with the reference potential or with the inverting input of the operational amplifier, and a second capacitor, the one electrode of which is connected either with a second potential or with the reference potential and the other electrode of which is connected with the reference potential or with the inverting input. Finally, a comparator is connected to the output of the operational amplifier and the arrangement is provided with a clock oscillator for controlling the switching processes.

10 Claims, 4 Drawing Sheets

CAPACITIVE SENSOR ARRANGEMENT

The present invention to a capacitive sensor arrangement with a charge balance frequency converter having an operational amplifier with an output and an inverting input. Between the output and the inverting input an integrating capacitor is connected and a noninverting input of the operational amplifier is connected with a reference potential. A first capacitor has one electrode connected with a first potential or with the reference potential and another electrode connected with the reference potential or with the inverting input of the operational amplifier. A second capacitor has one electrode connected either with a second potential or with the reference potential and another electrode connected with the reference potential or the inverting input. Finally, a comparator is connected at the output of the operational amplifier and the arrangement is provided with a clock oscillator for controlling switching operations.

The German patent DD 228 132 discloses an analog-digital converter which operates according to the charge balance principle by means of switched capacitances. The circuit arrangement for this consists of an operational amplifier having an output and an inverting input with an integrating capacitor $C_1$ connected therebetween. A noninverting input of the operational amplifier is connected with a reference potential, which represents the ground potential.

Furthermore, an input capacitor $C_E$ and a reference capacitor $C_R$ are provided. An electrode of the input capacitor $C_E$ is connected via a first reversing switch either with an input potential $U_E$ or with the reference potential. The other electrode of the input capacitor is connected by means of a second reversing switch, at the same time as the first reversing switch, with the reference potential or with the inverting input of the operational amplifier. The one electrode of the reference capacitor $C_R$ is connected via a third reversing switch either with a reference potential $U_R$ or with the reference potential. The other electrode of the reference capacitor $C_R$ is connected by means of a fourth reversing switch, at the same time as the third reversing switch, with the reference potential or the inverting input. A comparator is connected to the output of the operational amplifier. The first and second reversing switches are switched synchronously with a timing signal of a clock generator. The third and fourth reversing switches are switched synchronously by an output of a gate circuit, a switching signal being put out when the comparator output signals that its threshold voltage is exceeded. A quantity of charge $U_E + C_E$ is now transferred to the integrating capacitor in one cycle. This takes place for a number n of cycles while the threshold voltage of the comparator is exceeded repeatedly at the output of the operational amplifier, as a result of which the operational amplifier assumes in each case a different switching at its output. At the same time, when a clock pulse occurs, a switching pulse is triggered for the third and fourth reversing switches. With that, a quantity of charge $U_R + C_R$ is withdrawn from the integrating capacitor $C_I$ whenever the threshold voltage is exceeded. The output voltage of the operational amplifier in each case falls below the threshold voltage of the comparator, as a result of which the latter resumes its old initial state once again. For each cycle, charges $U_E + C_E$ are now supplied to the integrating capacitance $C_I$, until once again there is a voltage which exceeds the threshold voltage, at the output of the operational amplifier. With that, the process is repeated.

A number z of pulses at the gate output, in relation to the number of clock pulses, is a measure of the voltage relationship between $U_E$ and $U_R$, for which the following equation applies.

$$\frac{U_E}{U_R} = \frac{C_R}{C_E} \times \frac{n}{z}$$

Knowing the magnitude of $U_R$, $C_R$ and $C_E$ and n, z accordingly is a digital value for the analog parameter $U_E$.

In a solution according to the German Offenlegungsschrift 41 15 534, this charge balance method is used to measure a capacitance. Due to the construction of the input capacitor $C_E$ as a photocapacitor and, knowing the magnitudes of $U_E$, $U_R$, $C_R$ and n, the magnitude of the capacitance of $C_E$ can be expressed digitally with z and, with that, the analog magnitude of the light intensity can be expressed digitally.

Such a solution has a disadvantage in that the reference capacitor $C_R$ is a fixed component which is difficult to manufacture with the required degree of accuracy, at least for an integration of the circuit arrangement, and the values of which are subject to drift.

Capacitive sensors, as disclosed, for example, in the German patent 41 36 995, cannot be used for this known solution.

SUMMARY OF THE INVENTION

It is therefore an object of the present invention to provide a sensor arrangement according to the charge balance principle which, while assuring high accuracy of measurement, can be produced simply and is robust for various areas of use.

Pursuant to the present invention, the objective is accomplished due to the fact that in the above noted arrangements the first potential is set equal to the second potential, which represents an auxiliary potential. The first and second capacitors moreover are constructed as partial capacitors of a differential capacitor.

A differential capacitor is understood to be a capacitor, which is comprised of two partial capacitors, the capacitances of which change in opposite directions, the total capacitance remaining constant. The change in the partial capacitances is brought about by an external effect.

A special reference capacitor is avoided here. Both partial capacitors are subject to the same conditions, so that errors or drift phenomena are mutually canceled. Last, but not least, the accuracy of measurement is increased by these means.

The condition $$\frac{U_2}{U_2} = \frac{C_2}{C_1} \times \frac{n}{z} \text{ with } U_1 = U_2$$

is fulfilled by this arrangement, that is $$\frac{z}{n} = \frac{C_2}{C_1},$$

by means of which the ratio of $C_2$ to $C_1$ can be expressed digitally.

In a refinement of the present invention, provisions are made so that the output of the comparator is connected with a first input of a first AND element having a second input of which is connected with the clock oscillator. Moreover, the output of the first AND element is connected with a switch arrangement for switching the first and/or second electrode of the second capacitor in a controlling manner. An inverting output of the comparator is connected with a first input of a second AND element having a second input connect to the clock oscillator. Moreover the output of the second AND element is connected with a switch arrangement for switching the first and/or second electrode of the first capacitor in a controlling manner.

With this development, it is achieved that the condition $$C_2 > C_1$$

does not have to be observed, according to which only half the shift of a differential capacitor is available for a measurement. This arises from the fact that either $C_1$ or $C_2$ is in contact with the inverting input of the operational amplifier. Accordingly, $$(n-z) \times C_1 = z \times C_2$$

and with that $$\frac{C_1}{C_1 + C_2} = \frac{z}{n}.$$

Thus, practically the whole of the shift of the differential capacitor, such as a 180° rotation of a differential variable capacitor, can be used.

In an improvement of the above arrangement, a first switch, for switching the first electrode of the first capacitor, and a second switch, for switching the second electrode of the first capacitor, are provided. Moreover, the control inputs of the two switches are connected with the output of the clock oscillator or of the second AND element. Furthermore, a third switch for switching the first electrode of the second capacitor and a fourth switch for switching the second electrode of the second capacitor, are provided, control inputs of the two switches being connected with the output of the first AND element. The differential capacitor is constructed as a quadripole capacitor.

A different possibility for improving the above arrangement consists therein that, instead of the second and the fourth switches, a fifth switch is provided, which is in contact with the mutually connected second electrode of the first capacitor and the second electrode of the second capacitor and the control input of which is connected with the output of the clock oscillator. These can be connected between the inverting input and the reference potential. The first switch is disposed in order to switch the first electrode of the first capacitor, the control input of which is connected with the output of the clock oscillator or of the second AND gate. The third switch is disposed for switching the first electrode of the second capacitor, the control input of which is connected with the output of the first AND gate. In this connection, the differential capacitor is constructed as a tripolar capacitor. Accordingly, it is possible to use tripolar differential capacitors, the manufacturing costs of which are less.

A further development of the present invention is characterized in that, at the comparator output, a pulse shaper is connected, at the input of which pulses with a pulse-width duty cycle of 0.5 can be applied. The output pulses of this pulse shaper have a pulse width which corresponds approximately to a clock period of the clock pulse sequence. At this pulse shaper, a low-pass filter is connected, the output of which represents an analog output, the voltage $U_{out}$ of which is divided in relation to the operating voltage $V_{dd}$ so that $$\frac{U_{out}}{V_{dd}} = \frac{C_1}{C_1 + C_2}.$$

When the output of the comparator supplies a number z of pulses which, in relation to the number n of clock pulses, represents a digital measure of the relationship of the partial capacitors, an analog signal is put out at the output of the pulse shaper after low-pass filtration. This analog signal is proportional to the relationship of the partial capacities, that is, for example, to the angle of rotation of a potentiometer. Accordingly, with this embodiment, the whole arrangement can be connected as a tripole with the connections $V_{dd}$, reference potential and $U_{out}$ and, with that, be a substitute for potentiometers.

It is particularly advisable that the reference potential is at ground potential and the auxiliary potential (U) is at the operating potential $V_{dd}$. This avoids the need to provide additional potentials.

BRIEF DESCRIPTION OF THE DRAWINGS

An example of the present invention is described below in greater detail with reference to the associated drawings, wherein.

DETAILED DESCRIPTION

Figure 1:
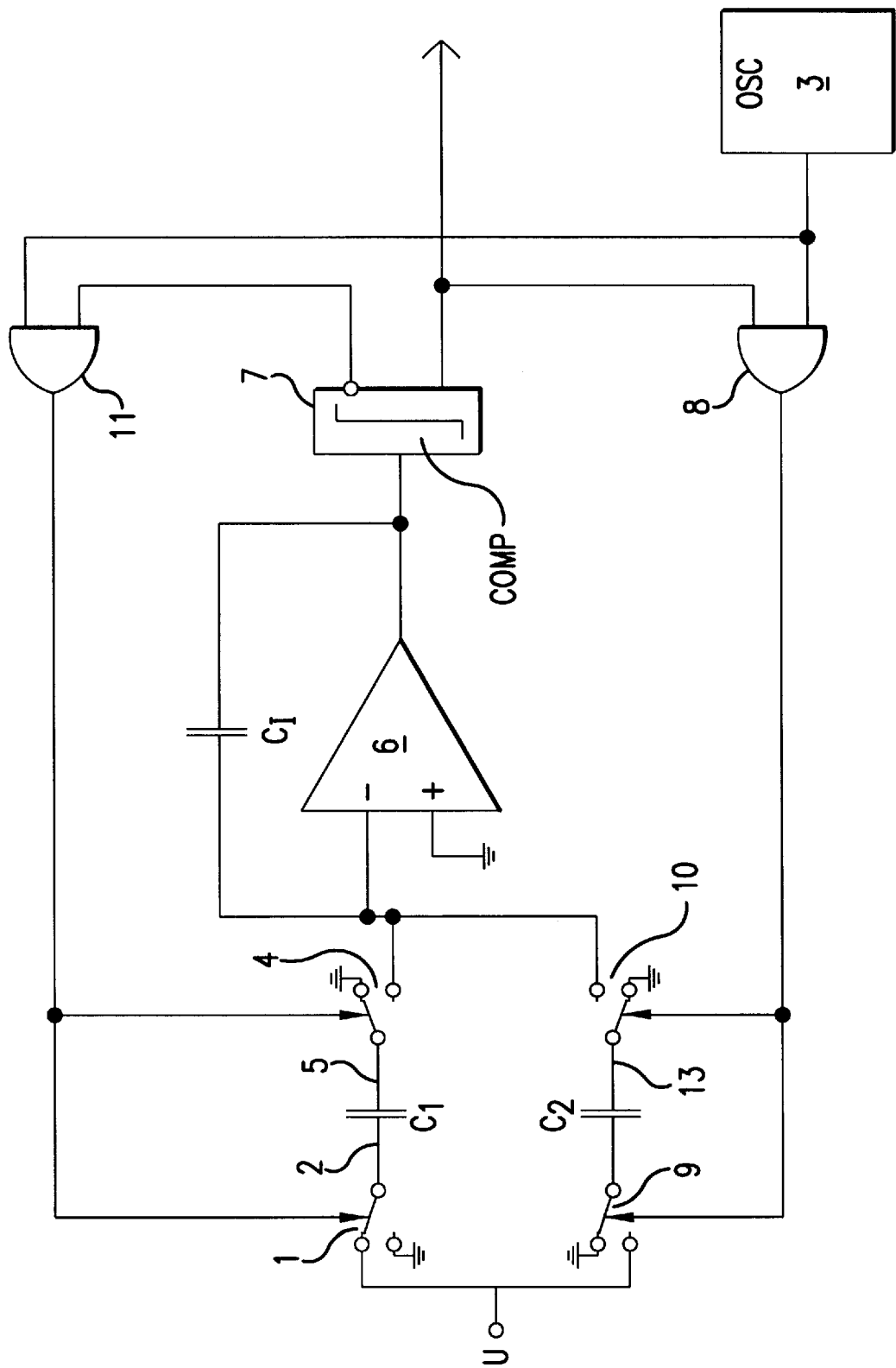
FIG. 1 shows a circuit arrangement of a first embodiment of the present invention.

Referring to FIG. 1, a first embodiment of the present invention has an operational amplifier 6 with an integrating capacitor $C_I$ connecting its output with its inverting input. A first switch 1 connects a first electrode 2 of a first capacitor $C_1$ with an auxiliary potential U and a second switch 4 alternately connects a second electrode 5 of the first capacitor $C_1$ to either ground potential or the inverting input. A second capacitor $C_2$ has a first electrode that is alternately connected to the auxiliary potential U or the ground potential by a third switch 9 and a second electrode that is alternately connected to the inverting input or the ground potential by a fourth switch 10. A comparator 7 has an output connected to a first input of a first AND element 8 which has second input connected to a clock oscillator 3. Moreover, the output of the first AND element 8 is connected to the third and fourth switches, 9 and 10, for switching the first and/or second electrode of the second capacitor $C_2$ in a controlling manner. An inverting output of the comparator is connected to a first input of a second AND element 11 having a second input connected to the clock oscillator. Moreover the output of the second AND element 11 is connected to first and second switches, 1 and 4, for switching the first and/or second electrode of the first capacitor in a controlling manner.

During a next cycle of the clock oscillator 3, the first switch 1 connects the first electrode 2 of the first capacitor $C_1$ to a reference potential, for which purpose the ground potential is used, and the second switch 4 connects the second electrode 5 to the inverting input of the operational amplifier 6. With that, the integrating capacitor $C_I$ takes over the quantity of charge from $C_1$. This process is repeated for some cycles until the output of the operational amplifier 6 has risen to such a value that the comparator 7, which is connected in series with the output of the operational amplifier 6, changes its output value. During a next clock pulse, a switching pulse is then applied via the first AND element 8 to the third and fourth switches 9 and 10, so that the quantity of charge, which has meanwhile collected in the second capacitor $C_2$, is subtracted from the integrating capacitor $C_I$. With that, the output quantity of the operational amplifier 6 falls and the output of the comparator 7 assumes its original value. Up to this time, the cycle is blocked at the first and second switches 1 and 4 by the second AND element 11.

Figure 3:
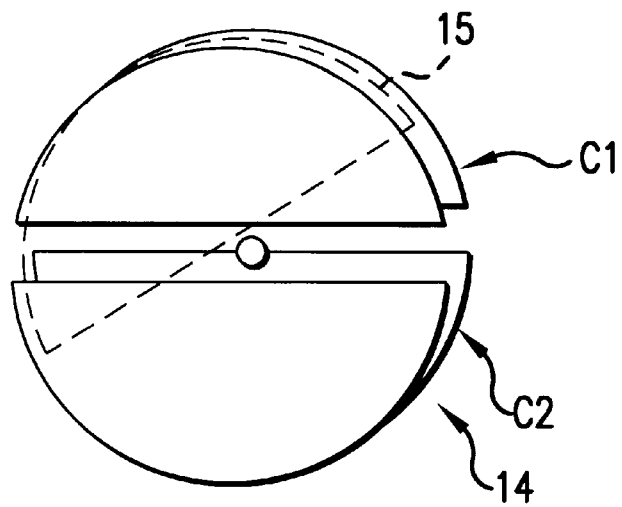
FIG. 3 shows a representation of a quadripolar variable capacitor.

When the output of the comparator 7 changes, the procedure can be repeated. The number z of the pulses at the output of the comparator 7, in relation to the number n of clock pulses, represents a digital measure of the relationship of $C_1$ to $C_1 + C_2$. With this development, it is achieved that the condition $$C_2 > C_1$$

does not have to be observed. Where the first and second capacitors, $C_1$ and $C_2$, take the form of a differential capacitor as shown in FIG. 3, the condition $C_2 > C_1$ permits only half the shift of a differential capacitor to be available for a measurement. Since either $C_1$ or $C_2$ is in contact with the inverting input of the operational amplifier 6, $$(n-z) \times C_1 = z \times C_2$$

and with that $$\frac{C_1}{C_1 + C_2} = \frac{z}{n}.$$

Thus, practically the whole of the shift of a differential capacitor, such as a 180° rotation of a differential variable capacitor, can be used.

Figure 2:
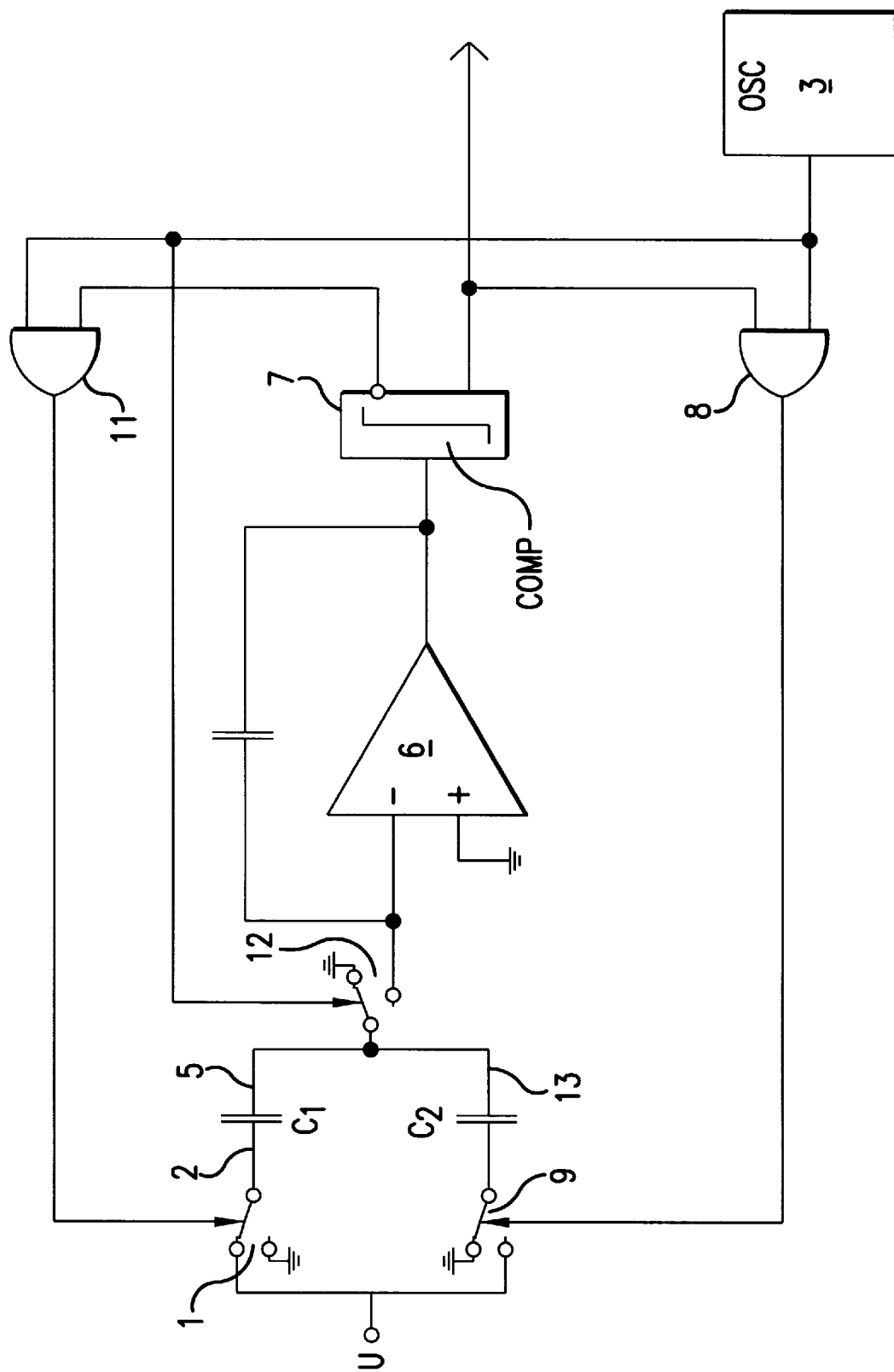
FIG. 2 shows a circuit arrangement of a second embodiment of the present invention.

Referring to FIG. 2, a second embodiment of the present invention is similar to the first embodiment except as discussed below. A fifth switch 12 is provided instead of the second switch 4 and the fourth switch 10 of FIG. 1. The second electrode 5 of the first capacitor $C_1$ and the second electrode 13 of the second capacitor $C_2$ are connected together at the fifth switch 12. The charge carrier balance is realized here only over the first switch 1 and the third switch 9. The fifth switch 12 is switched directly by the pulses of the clock oscillator 3.

Figure 5:
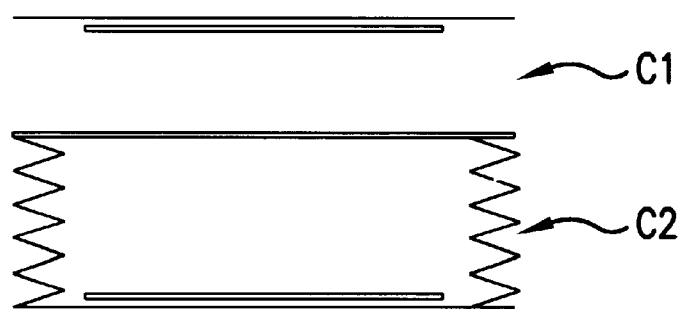
FIG. 5 shows a representation of a tripolar capacitive pressure sensor.

The advantage of the circuit of the second embodiment of FIG. 2 is that a tripolar differential capacitor 14, as shown in FIG. 5, can be used.

Figure 4:
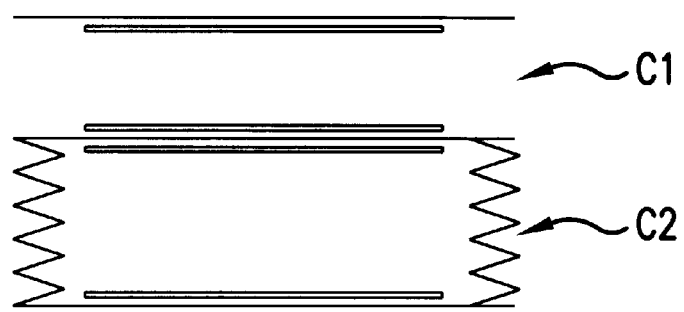
FIG. 4 shows a representation of a quadripolar capacitive pressure sensor.

For a circuit arrangement as shown in FIG. 1, a quadripolar differential capacitor 14, as shown in FIG. 3, is required. According to FIG. 3, a dielectric 15 can be rotated between the electrodes of two partial capacitors $C_1$ and $C_2$. Alternatively, a quadripolar capacitive pressure sensor as shown in FIG. 4 may be used.

Figure 6:
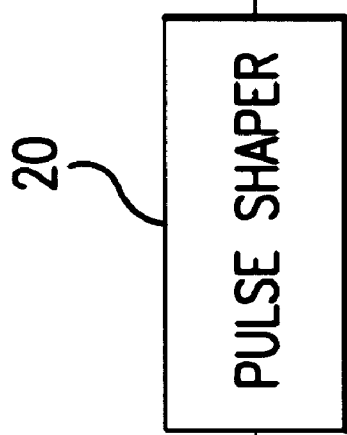
FIG. 6 shows an output configuration of the present invention.

Referring to FIG. 6, a further development of the present invention provides a pulse shaper 20 having an input connected to the output of the comparator 7. Pulses with a pulse-width duty cycle ratio of 0.5 can be applied. Output pulses of the pulse shaper 20 have a pulse width which corresponds approximately to a clock period of the clock pulse sequence. The output pulses of the pulse shaper 20 are applied to a low-pass filter which produces an output $U_{out}$ that represents an analog output. Preferably the voltage $U_{out}$ is divided in relation to the operating voltage $V_{dd}$ so that $$\frac{U_{out}}{V_{dd}} = \frac{C_1}{C_1 + C_2}.$$

When the output of the comparator supplies a number z of pulses which, in relation to the number n of clock pulses, represents a digital measure of the relationship of the capacitors $C_1$ and $C_2$. The analog signal is produced by the pulse shaper and low-pass filtration and is proportional to the relationship of the partial capacities, that is, for example, to the angle of rotation of a potentiometer. Accordingly, this embodiment provides an arrangement that can be connected as a tripole with the connections $V_{dd}$, reference potential and $U_{out}$ and, with that, be a substitute for potentiometers.

It is particularly advisable that the reference potential is at ground potential and the auxiliary potential (U) is at the operating potential $V_{dd}$. This avoids the need to provide additional potentials.

What is claimed is:
1. A capacitive sensor comprising:
   an operational amplifier having an op amp output, a noninverting input and an inverting input;
   an integrating capacitor connected between the inverting input and the op amp output;
   the noninverting input being connected to a reference potential;
   a first capacitor having a first electrode and a second electrode;
   first connecting means for alternately connecting the first electrode of the first capacitor to a first potential or to the reference potential and respectively alternately connecting the second electrode of the first capacitor to the reference potential or to the inverting input of the operational amplifier;
   a second capacitor having a first electrode and a second electrode;
   second connecting means for alternately connecting the first electrode of the second capacitor to a second potential or to the reference potential and for respectively alternately connecting the second electrode of the second capacitor to the reference potential or to the inverting input;
   a comparator having an input connected to the op amp output;
   a clock oscillator for producing a clock signal;
   control means, responsive to output from the comparator, for controlling switching processes of the first and second connecting means by application of said clock signal alternately thereto based on said output from said comparator;
   the first potential being equal to the second potential;
   the first capacitor and the second capacitor being partial capacitors of a differential capacitor; and
   the control means including:
     a first AND element having first and second inputs and an output;
     a second AND element having first and second inputs and an output;

the output of the comparator being applied noninverted to the first input of the first AND element, the clock signal being applied to the second input of the first AND element, and the output of the first AND element being connected to the second connecting means for switching at least one of the first electrode or the second electrode of the second capacitor to effect said alternate connecting thereof; and the output of the comparator being applied inverted to the first input of the second AND element, the clock signal being applied to the second input of the second AND element and the output of the second AND element being applied to the first connecting means for switching at least one of the first electrode or the second electrode of the first capacitor to effect said alternate connecting thereof.

2. The capacitive sensor of claim 1 wherein:

the first connecting means includes:

a first switch for switching the first electrode of the first capacitor to alternately connect the first electrode of the first capacitor to the first potential or to the reference potential, the first switch having a control input;

a second switch for switching the second electrode of the first capacitor to alternately connect the second electrode of the first capacitor to the reference potential or to the inverting input of the operational amplifier, the second switch having a control input; and the control inputs of the first and second switches being connected to the output of the second AND element;

the second connecting means includes:

a third switch for switching the first electrode of the second capacitor to alternately connect the first electrode of the second capacitor to the second potential or to the reference potential, the third switch having a control input;

a fourth switch for switching the second electrode of the second capacitor to alternately connect the second electrode of the second capacitor to the reference potential or to the inverting input, the fourth switch having a control input; and the control inputs of the third and fourth switches being connected to the output of the first AND element; and the differential capacitor being a quadripole capacitor.

3. A capacitive sensor comprising:

an operational amplifier having an op amp output, a noninverting input and an inverting input;

an integrating capacitor connected between the inverting input and the op amp output;

the noninverting input being connected to a reference potential;

a first capacitor having a value C1 and having a first electrode and a second electrode;

first connecting means for alternately connecting the first electrode of the first capacitor to a first potential or to the reference potential and respectively alternately connecting the second electrode of the first capacitor to the reference potential or to the inverting input of the operational amplifier;

a second capacitor having a value C2 and having a first electrode and a second electrode;

second connecting means for alternately connecting the first electrode of the second capacitor to a second potential or to the reference potential and for respectively alternately connecting the second electrode of the second capacitor to the reference potential or to the inverting input;

a comparator having an input connected to the op amp output;

a clock oscillator for producing a clock signal;

control means, responsive to output from the comparator, for controlling switching processes of the first and second connecting means by application of said clock signal alternately thereto based on said output from said comparator;

the first potential being equal to the second potential;

the first capacitor and the second capacitor being partial capacitors of a differential capacitor;

a pulse shaper having an output and an input with output from said comparator applied thereto, the pulse shaper accepting pulses at the input thereof with a pulse-width duty cycle ratio of 0.5 and producing output pulses in response thereto with a pulse width corresponding approximately to a clock period of the clock signal; and a low-pass filter connected to the output of the pulse shaper to produce a filtered output which is an analog output having an average voltage $U_{out}$ related to an operating voltage $V_{dd}$ as characterized by the equation $$\frac{U_{out}}{V_{dd}} = \frac{C_1}{C_1 + C_2}.$$

4. The capacitive sensor arrangement of claim 1, wherein the reference potential is at ground potential and the first and second potentials are at an operating supply voltage $V_{dd}$.

5. A capacitive sensor comprising:

an operational amplifier having an op amp output, a noninverting input and an inverting input;

an integrating capacitor connected between the inverting input and the op amp output;

the noninverting input being connected to a reference potential;

a first capacitor having a first electrode and a second electrode;

a second capacitor having a first electrode and a second electrode in common with the second electrode of the first capacitor thereby forming a common electrode;

first connecting means for alternately connecting the first electrode of the first capacitor to a first potential or to the reference potential;

a second connecting means for respectively alternately connecting the first electrode of the second capacitor to the reference potential or to the first potential; and a third connecting means for alternately connecting the common electrode to one of the reference potential and the inverting input respectively when one of said first and second connecting means is respectively connecting a respective one of said first electrodes to one of the first potential and the reference potential;

a comparator having an input connected to the op amp output;

a clock oscillator for producing a clock signal;

control means, responsive to output from the comparator, for controlling switching processes of the first, second and third connecting means by application of said clock signal thereto based on said output from said comparator;

the first capacitor and the second capacitor being partial capacitors of a differential capacitor; and the control means including:

a first AND element having first and second inputs and an output;

a second AND element having first and second inputs and an output;

the output of the comparator being applied noninverted to the first input of the first AND element, the clock signal being applied to the second input of the first AND element, and the output of the first AND element being connected to the second connecting means for switching the first electrode of the second capacitor to effect said alternate connecting thereof;

the output of the comparator being applied inverted to the first input of the second AND element, the clock signal being applied to the second input of the second AND element and the output of the second AND element being applied to the first connecting means for switching of the first electrode of the first capacitor to effect said alternate connecting thereof; and the clock signal being applied to the third connecting means to effect said connecting of said common electrode to one of the reference potential and the inverting input.

6. The capacitive sensor of claim 5 wherein:

the first connecting means includes:

a first switch for switching the first electrode of the first capacitor to alternately connect the first electrode of the first capacitor to the first potential or to the reference potential, the first switch having a control input; and the control input of the first switch being connected to the output of the second AND element;

the second connecting means includes:

a second switch for switching the first electrode of the second capacitor to alternately connect the first electrode of the second capacitor to the second potential or to the reference potential, the second switch having a control input; and the control input of the second switch being connected to the output of the first AND element; and the third connecting means includes:

a third switch for switching the common electrode of the first and second capacitor to alternately connect the common electrode to the reference potential or to the inverting input, the second switch having a control input; and the control input of the third switch having the clock signal applied thereto to effect connecting the common electrode to one of the reference potential and the inverting input respectively when one of said first and second connecting means is respectively connecting a respective one of said first electrodes to one of the first potential and the reference potential.

7. The capacitive sensor of claim 6 further comprising:

a pulse shaper having an output and an input with output from said comparator applied thereto, the pulse shaper accepting pulses at the input thereof with a pulse-width duty cycle ratio of 0.5 and producing output pulses in response thereto with a pulse width corresponding approximately to a clock period of the clock signal; and a low-pass filter connected to the output of the pulse shaper to produce a filtered output which is an analog output having an average voltage $U_{out}$ related to an operating voltage $V_{dd}$ as characterized by the equation $$\frac{U_{out}}{V_{dd}} = \frac{C_1}{C_1 + C_2}.$$

8. The capacitive sensor of claim 7 wherein the reference potential is at ground potential and the first potential is at an operating supply voltage $V_{dd}$.

9. The capacitive sensor of claim 5 further comprising:

a pulse shaper having an output and an input with output from said comparator applied thereto, the pulse shaper accepting pulses at the input thereof with a pulse-width duty cycle ratio of 0.5 and producing output pulses in response thereto with a pulse width corresponding approximately to a clock period of the clock signal; and a low-pass filter connected to the output of the pulse shaper to produce a filtered output which is an analog output having an average voltage $U_{out}$ related to an operating voltage $V_{dd}$ as characterized by the equation $$\frac{U_{out}}{V_{dd}} = \frac{C_1}{C_1 + C_2}.$$

10. The capacitive sensor of claim 9 wherein the reference potential is at ground potential and the first potential is at an operating supply voltage $V_{dd}$.

* * * * *